United States Patent
Ohashi et al.

(10) Patent No.: US 9,230,775 B2
(45) Date of Patent: Jan. 5, 2016

(54) CHARGED PARTICLE INSTRUMENT

(75) Inventors: Takeyoshi Ohashi, Tokyo (JP);
Yasunari Sohda, Kawasaki (JP);
Makoto Ezumi, Mito (JP); Muneyuki Fukuda, Kokubunji (JP); Noritsugu Takahashi, Kokubunji (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 211 days.

(21) Appl. No.: 13/451,596

(22) Filed: Apr. 20, 2012

(65) Prior Publication Data

US 2012/0286160 A1 Nov. 15, 2012

(30) Foreign Application Priority Data

May 9, 2011 (JP) ................. 2011-103949

(51) Int. Cl.
*H01J 37/00* (2006.01)
*H01J 37/28* (2006.01)
*H01J 37/26* (2006.01)

(52) U.S. Cl.
CPC .............. *H01J 37/28* (2013.01); *H01J 37/265* (2013.01); *H01J 2237/1532* (2013.01); *H01J 2237/1536* (2013.01); *H01J 2237/2811* (2013.01)

(58) Field of Classification Search
CPC . H01J 2237/2817; H01J 37/21; H01J 37/147; H01J 37/1471; H01J 2237/24528; H01J 2237/1532; H01J 37/2826

USPC ................. 250/306, 307, 310, 311
See application file for complete search history.

(56) References Cited

U.S. PATENT DOCUMENTS

| | | | |
|---|---|---|---|
| 7,385,194 B2* | 6/2008 | Kamimura et al. | 250/306 |
| 2003/0209674 A1* | 11/2003 | Hamaguchi et al. | 250/396 ML |
| 2005/0040332 A1* | 2/2005 | Kochi et al. | 250/310 |
| 2006/0151698 A1* | 7/2006 | Sasaki et al. | 250/310 |
| 2007/0164219 A1* | 7/2007 | Shishido et al. | 250/310 |
| 2009/0041333 A1* | 2/2009 | Yamaguchi et al. | 382/147 |
| 2013/0026361 A1* | 1/2013 | Yamanashi et al. | 250/307 |

FOREIGN PATENT DOCUMENTS

| | | |
|---|---|---|
| JP | 2006-173035 | 6/2006 |
| JP | 2007-187538 | 7/2007 |

* cited by examiner

*Primary Examiner* — Michael Maskell
(74) *Attorney, Agent, or Firm* — Baker Botts L.L.P.

(57) ABSTRACT

A charged particle instrument including a controlling and operating unit for controlling a charged particle source, deflecting means, and focus changing means and making a data for an image by an electric signal detected by a detector, and a recording unit for preserving a correction coefficient registered at each image-acquisition, in which the controlling and operating unit acquires plural images while changing a focus, and controls an optical condition such that a landing angle of a charged particle beam becomes perpendicular when an image for measurement is acquired on the basis of a position shift amount of a mark in the image and a correction coefficient registered to the recording unit.

14 Claims, 18 Drawing Sheets

| X (μm) | Y (μm) | ISX (LSB) | ISY (LSB) |
|---|---|---|---|
| −15 | −15 | 49124 | 48520 |
| −15 | −7.5 | 48042 | 39548 |
| −15 | 0 | 47008 | 32356 |
| ⋮ | ⋮ | ⋮ | ⋮ |

| ACCELERATING VOLTAGE | OPTICAL MODE | A | B | C | D |
|---|---|---|---|---|---|
| 300 | HR | 0.011 | 0.022 | 0.021 | −0.010 |
| 300 | DOF | 0.010 | 0.019 | 0.018 | −0.009 |
| 500 | HR | 0.008 | 0.014 | 0.013 | −0.008 |
| ⋮ | ⋮ | ⋮ | ⋮ | ⋮ | ⋮ |

FIG. 9A

| CORRECTION OF LANDING ANGLE IS PERFORMED |
|---|

FIG. 9B

CORRECTION OF LANDING ANGLE IS NEEDED

| OK | CANCEL |

FIG. 9C

MEASUREMENT RESULT: LANDING ANGLE

| X(μm) | Y(μm) | θX(°) | θY(°) |
|---|---|---|---|
| 15 | 15 | 0.2 | 0.8 |

CORRECTION OF LANDING ANGLE IS NEEDED

| OK | CANCEL |

FIG. 10

| X (μm) | Y (μm) | ALX ADJUSTMENT (LSB) | ALY ADJUSTMENT (LSB) |
|---|---|---|---|
| −15 | −15 | 58 | 68 |
| −15 | −7.5 | 38 | 35 |
| −15 | 0 | 24 | 7 |
| ⋮ | ⋮ | ⋮ | ⋮ |

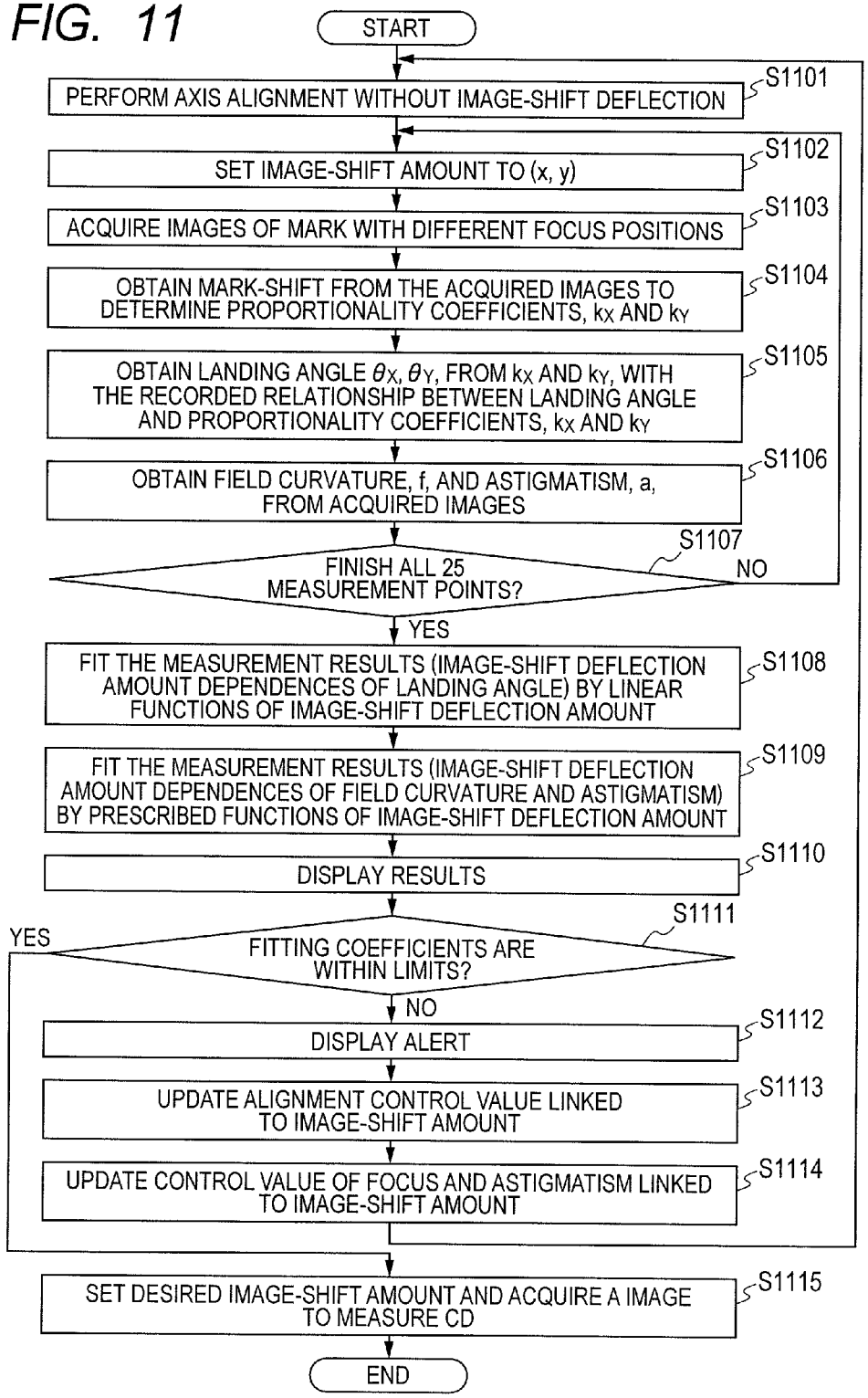

FIG. 13A

CORRECTION FOR UNIFORMITY WITHIN
AN IMAGE-SHIFT RANGE IS PERFORMED

FIG. 13B

CORRECTION FOR UNIFORMITY WITHIN
AN IMAGE-SHIFT RANGE IS NEEDED

| OK | CANCEL |

FIG. 13C

| MEASUREMENT RESULTS | | | | | | |
|---|---|---|---|---|---|---|
| X (μm) | Y (μm) | θX (°) | θY (°) | FOCUS (nm) | STIGMA X (nm) | STIGMA Y (nm) |
| 15 | 15 | 0.2 | 0.8 | 380 | 240 | 80 |

CORRECTION FOR UNIFORMITY WITHIN
AN IMAGE-SHIFT RANGE IS NEEDED

| OK | CANCEL |

FIG. 14

| X (μm) | Y (μm) | FOCUS ADJUSTMENT (LSB) | ASTIGMATISM X ADJUSTMENT (LSB) | ASTIGMATISM Y ADJUSTMENT (LSB) |
|---|---|---|---|---|
| −15 | −15 | 16 | 8 | 23 |
| −15 | −7.5 | 12 | 5 | 15 |
| −15 | 0 | 9 | 2 | 10 |
| ⋮ | ⋮ | ⋮ | ⋮ | ⋮ |

| θ (°) | CD CORRECTION (nm) |
|---|---|
| −1.0 | −0.82 |
| −0.9 | −0.70 |
| −0.8 | −0.60 |
| ⋮ | ⋮ |

| SCHEDULED CORRECTION FOR UNIFORMITY WITHIN AN IMAGE-SHIFT RANGE | ◉ ON | ◎ OFF |

CHARGED PARTICLE INSTRUMENT

CLAIM OF PRIORITY

The present application claims priority from Japanese patent application JP 2011-103949 filed on May 9, 2011, the content of which is hereby incorporated by reference into this application.

FIELD OF THE INVENTION

The present invention relates a charged particle instrument for measuring a dimension of a fine pattern of a sample.

BACKGROUND OF THE INVENTION

A scanning electron microscope (SEM) which is one of charged particle instruments accelerates electrons emitted from an electron source, and converges the electrons by an electrostatic or electromagnetic lens to irradiate a surface of a sample therewith. The electrons are referred to as a primary electron-beam. Secondary electrons are generated from the sample by the irradiation of the primary electron-beam. An amount of generating the secondary electrons is increased at an edge portion of a sample pattern. Therefore, a secondary electron signal intensity is acquired by scanning the primary electron-beam on the surface of the sample by an electromagnetic deflection. Then, an electron microscope image (SEM image) reflecting a shape of the sample is obtained. Such an SEM can observe a fine pattern by converging the primary electron-beam to be small. Therefore, the SEM is used for measuring a dimension of a fine circuit pattern in a semiconductor fabricating process.

In SEM, ordinarily, a landing angle of a primary electron-beam relative to a sample is perpendicular in a case of no deflection. On the other hand, in a case of deflection, generally, a trajectory of a primary electron-beam is changed and the landing angle is changed. When the landing angle differs, even when an image of the same sample pattern is acquired, a way of looking of a pattern is changed, and a critical dimension (CD) is changed. In addition, when a primary electron-beam is deflected, deflection aberrations of field curvature, astigmatism, coma aberration, distortion, chromatic aberration and the like are generated. The critical dimension is changed also by blurring or distorting an image by the deflection aberrations.

In measuring a dimension of a semiconductor circuit pattern, there is requested a high CD reproducibility less than 1 nm. In order to ensure the high CD reproducibility, a deflection region of a primary electron-beam is restricted to be less than, for example, 5 μm such that a change in the CD caused by the deflections is not manifested. On the other hand, there are increased a number of cases where the measurement is needed at a number of portions in the same sample. It is requested to increase a throughput by reducing a frequency of moving a stage for moving a field of view by scanning a wide region by deflecting the primary electron-beam. In order to realize compatibility of the CD reproducibility and the throughput as described above, it is necessary to enable to use a wide deflection region by restraining a change in the critical dimension (CD) caused by the deflection.

With regard to the problem, Japanese Unexamined Patent Application Publication No. 2006-173035 discloses a method of correcting field curvature, astigmatism, and distortion caused by deflecting a primary electron-beam. Also, Japanese Unexamined Patent Application Publication No. 2007-187538 discloses a method of making a landing angle equal in a deflection region.

SUMMARY OF THE INVENTION

In Japanese Unexamined Patent Application Publication No. 2006-173035, a method of measuring field curvature, astigmatism, and distortion and correcting the deflection aberrations is disclosed; however, a method of dealing with a change in a landing angle of a primary electron-beam is not described. Japanese Unexamined Patent Application Publication No. 2007-187538 discloses a method of measuring a landing angle using a pyramid pattern and restraining a change in the landing angle in accordance with deflection. However, a method of correcting a deflection aberration is not described therein. In order to enable to use a wide deflection region by restraining a change in a critical dimension (CD) caused by deflection, it is necessary to restrain both of the deflection aberration and the change in the landing angle. However, in each of the two methods described above, only one of the both can be restrained by itself.

Moreover, it is difficult to combinedly apply the two methods described above by the following reason. In measuring the landing angle, a sample having a specific three-dimensional structure such as a micro-pyramid is needed, and the micro-pyramid ordinarily has a height of about 1 μm. Therefore, even when, for example, field curvature is going to be measured using the micro-pyramid, the field curvature can be measured only with an accuracy of about 1 μm. On the other hand, in order to achieve high CD reproducibility equal to or less than 1 nm, a measuring accuracy of a focus equal to or less than 100 nm is needed, and these samples are not appropriate.

It is an object of the present invention to make a wide deflection region and high CD reproducibility which has been difficult to be compatible with each other in image shift compatible with each other.

According to an aspect of the present invention to achieve the object described above, there is provided a charged particle instrument which includes a charged-particle source; a deflecting part configured to deflect a charged particle beam emitted from the charged-particle source; a focus changing part configured to change a focus of the charged particle beam; a detector configured to detect an electric signal from a sample irradiated with the charged particle beam; a controlling and operating part configured to control the charged-particle source, the deflecting part, and the focus changing part and to make data for an image with the electric signal detected by the detector; and a recording part configured to preserve a correction coefficient registered for each image-acquisition condition, in which the controlling and operating part acquires multiple numbers of sheets of images of the same mark on the sample by changing the focus by the focus position changing part by deflecting the charged particle beam by a prescribed amount by the deflecting part, and controls an optical condition such that a landing angle of the charged particle beam becomes a desired value when an image for measurement is acquired by deflecting the charged particle beam by the prescribed amount on the basis of a position shift amount of the mark in the acquired image of the mark, and the correction coefficient registered to the recording unit.

Further, according to another aspect of the present invention, there is provided a charged particle instrument which includes a charged-particle source; a deflecting part configured to deflect a charged particle beam emitted from the charged-particle source; a focus changing part configured to change a focus of the charged particle beam; a detector configured to detect an electric signal from a sample irradiated with the charged particle beam; a controlling and operating part configured to control the charged-particle source, the deflecting part, and the focus changing part and to make data for an image with the electric signal detected by the detector; and a recording part configured to preserve a correction coefficient registered for each image-acquisition condition, in which the controlling and operating part acquires multiple numbers of sheets of the images of the same mark on the sample by changing the focus by the focus changing part by deflecting the charged particle beam by a prescribed amount by the deflecting part, acquires an image of a small pattern made on the sample by deflecting the charged particle beam by the prescribed amount and measures a dimension of the small pattern on the basis of the image of the small pattern, and corrects a measured value of the small pattern on the basis of a position shift amount of the mark in the acquired image of the mark, and the correction coefficient registered to the recording unit.

Further, according to still another aspect of the present invention, there is provided a charged particle instrument which includes a charged-particle source; a deflecting part configured to deflect a primary charged particle beam emitted from the charged-particle source; a focus changing part configured to change a focus of the primary charged particle beam emitted from the charged-particle source; a detector configured to detect an electric signal from a sample irradiated with the primary charged particle beam; a controlling and operating part configured to control the charged-particle source, the deflecting part, and the focus changing part and to make data for an image with the electric signal detected by the detector; and a recording part configured to preserve a correction coefficient registered for each image-acquisition condition, in which the controlling and operating part deflects the primary charged beam by multiple different amounts by the deflecting part, acquires an image of a mark a three-dimensional shape on the sample of which is already known, calculates a landing angle of the primary charged particle beam from a shape pattern of the acquired image of the mark, and registers a coefficient calculated from a relationship between a deflection amount of the primary charged particle beam and the calculated landing angle to the recording unit.

The use of the present invention can reduce a change in a critical dimension in accordance with deflection of a primary charged particle beam during image shift and can make a wide deflection region and high CD reproducibility compatible with each other.

BRIEF DESCRIPTION OF THE DRAWINGS

FIGS. 9A, 9B, and 9C show other examples of display screens in the charged particle instrument according to the second embodiment;

FIG. 10 is an explanatory diagram of the charged particle instrument according to the second embodiment, and is a table showing an alignment control value linked to image-shift;

FIG. 11 is a flowchart in measuring and correcting the landing angle using the charged particle instrument according to the third embodiment;

FIGS. 13A, 13B, and 13C show other examples of display screens in the charged particle instrument according to the third embodiment;

FIG. 14 is an explanatory diagram of the charged particle instrument according to the third embodiment, and is a table showing examples of an alignment control value linked to image-shift, a focus adjustment value, and an astigmatism adjustment value;

DETAILED DESCRIPTION OF THE PREFERRED EMBODIMENTS

As an example for resolving the problem described above, there are proposed an algorithm of measuring a landing angle which does not need a sample having a specific three-dimensional structure such as a pyramid sample as well as a charged particle instrument which feeds back a result of measurement by the algorithm to controlling of optics.

Specifically, by fixing a position of a stage, plural images are acquired while changing a focus, a proportionality coefficient of a change in the focus and a shift in a position of irradiation of a beam is calculated by measuring a movement of a pattern in the image, and a relationship between the proportionality coefficient and the landing angle is previously calculated, thereby calculating the landing angle. The landing angle is measured at a prescribed deflection amount, thereafter, when deflected to the deflection amount, a result of measurement is fed back to controlling of optics such that the landing angle becomes perpendicular. Further, in addition to the method described above, there are provided a method of measuring field curvature by measuring image sharpness of the same plural images and calculating the focus which maximizes the image sharpness from a relationship between the change in the focus and the image sharpness as well as a method of measuring astigmatism by measuring the image sharpnesses in respective directions of the same plural images and calculating shifts of the focus which maximizes the image sharpness depending on the directions from a relationship between the change in the focus and the image sharpness. The results of measurement are also fed back to controlling of optics by also using the measurement results of field curvature and astigmatism.

Although the present invention can be adapted to various kinds of charged particle instruments which use not only electrons but also ions, in the following embodiments, an explanation will be given by taking an example of SEM.

In addition, although by using the present invention, optical conditions can be controlled such that the landing angle becomes a desired value, in the following embodiments, an explanation will be given by taking an example of a case of controlling the landing angle to be perpendicular.

First Embodiment

Figure 1:
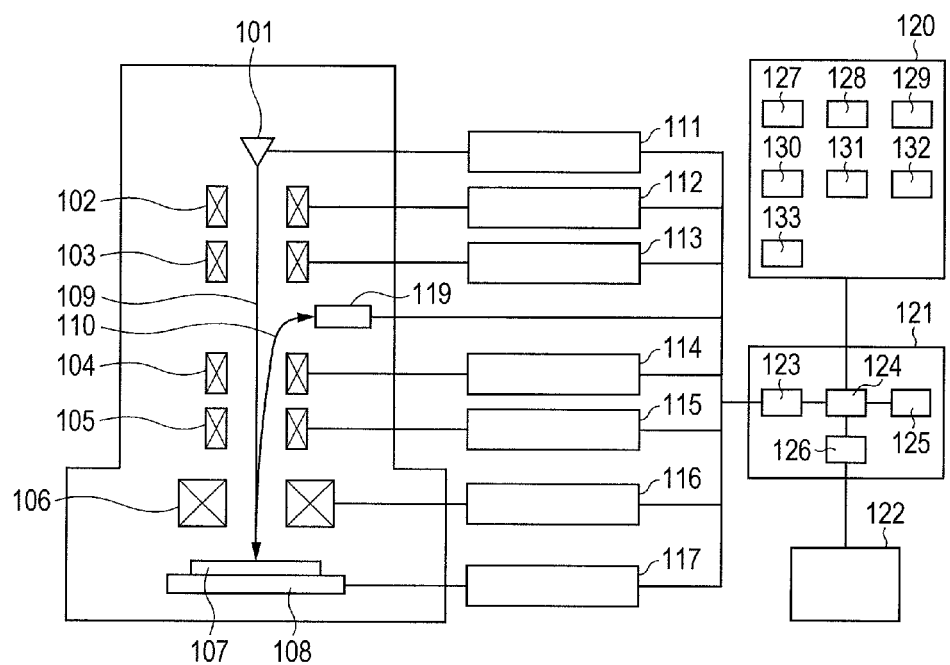
FIG. 1 is an outline total configuration diagram of a charged particle instrument (electron microscope) according to first through ninth embodiments.

An explanation will be given of a first embodiment according to the present invention in reference to FIG. 1 through FIG. 5. FIG. 1 is an outline total configuration diagram of a scanning electron microscope according to the present embodiment. A primary electron-beam 109 which is emitted from an electron gun (electron source) 101 that is controlled by an electron gun controller 111 is converged onto a surface of a sample 107 which is placed above a stage 108 to irradiate therewith. A focus of the primary electron-beam is adjusted by controlling excitation of an objective lens 106 by an objective lens controller 116, or controlling a retarding potential which is applied on the stage 108 by a retarding potential controller 117. Although in FIG. 1, an electrostatic or electromagnetic lens other than the objective lens is omitted, there may be one or plural lens(es) for converging the primary electron-beam other than the objective lens. Astigmatism of the primary electron beam 109 is corrected by controlling a current value of an astigmatism corrector 102 by an astigmatism corrector controller 112.

A secondary electron 110 which is generated from the surface of the sample by irradiation of the primary electron-beam is detected by a detector 119.

The primary electron-beam 109 can scan on the surface of the sample by controlling a scan-deflector 105 by a scan-deflector controller 115. In addition, an irradiation range of a primary electron can be moved by controlling an image-shift deflector 104 by an image-shift deflector controller 114 without moving the stage.

Furthermore, apart from the deflectors described above, an alignment deflector 103 for deflecting the primary electron is installed, and the landing angle of the primary electron-beam can be changed by controlling the deflection amount by an alignment deflector controller 113. Incidentally, an angle of incidence of the primary electron-beam may be changed by a method which uses a deflector other than the alignment deflector. Although in FIG. 1, a deflector other than the image-shift deflector 104, the alignment deflector 103, and the scan deflector 105 is omitted, there may be provided a deflector which deflects the primary electron-beam 109 with an object other than the objects of the deflectors described above. Two or more of the respective deflectors may also be provided.

A controlling and operating device 121 of a total of the instrument (SEM) includes a processor of processing a control program which represents a previously registered operation procedure or the like, and is configured by a control signal generator 123 for transmitting a control signal to each controller, an operation unit 124 of processing data, a memory 125 for temporarily preserving data, a display data generator 126 of generating data displayed to a display device 122 and the like. Furthermore, a recording device 120 includes an image-shift control amount preserving region 127 of preserving a relationship between an image-shift deflection amount and a control value of the image-shift deflector controller 114, a landing angle correction coefficient preserving region 128, a focus astigmatism change coefficient preserving region 129 of preserving a relationship between a focus change amount and a control value of the objective lens controller 116 or the retarding potential controller 117 as well as a relationship between an astigmatism change amount and a control value of the astigmatism corrector controller 112, a landing angle change coefficient preserving region 130 of preserving a relationship between a change in the landing angle of the primary electron-beam and a change in a control value of the alignment deflector controller 113, an alignment control amount linked to image-shift preserving region 131 of recording a correction amount of a control value of the alignment deflector controller 113 linked to an image-shift amount, a focus astigmatism control amount linked to image-shift preserving region 132 of recording a correction amount of a control value of the objective lens controller 116 or the retarding potential controller 117 linked to an image-shift amount, and a correction amount of a control value of the astigmatism corrector controller 112, and a dimension correction value preserving region 133 for reading or writing data by the operation unit 124 as necessary.

In SEM, a secondary electron signal intensity which is obtained at the image detector 119 is generated at the display data generator 126 as an image data by being arranged in accordance with a control signal to the scan-deflector controller 115, and is displayed on the display device 122.

Figure 2:
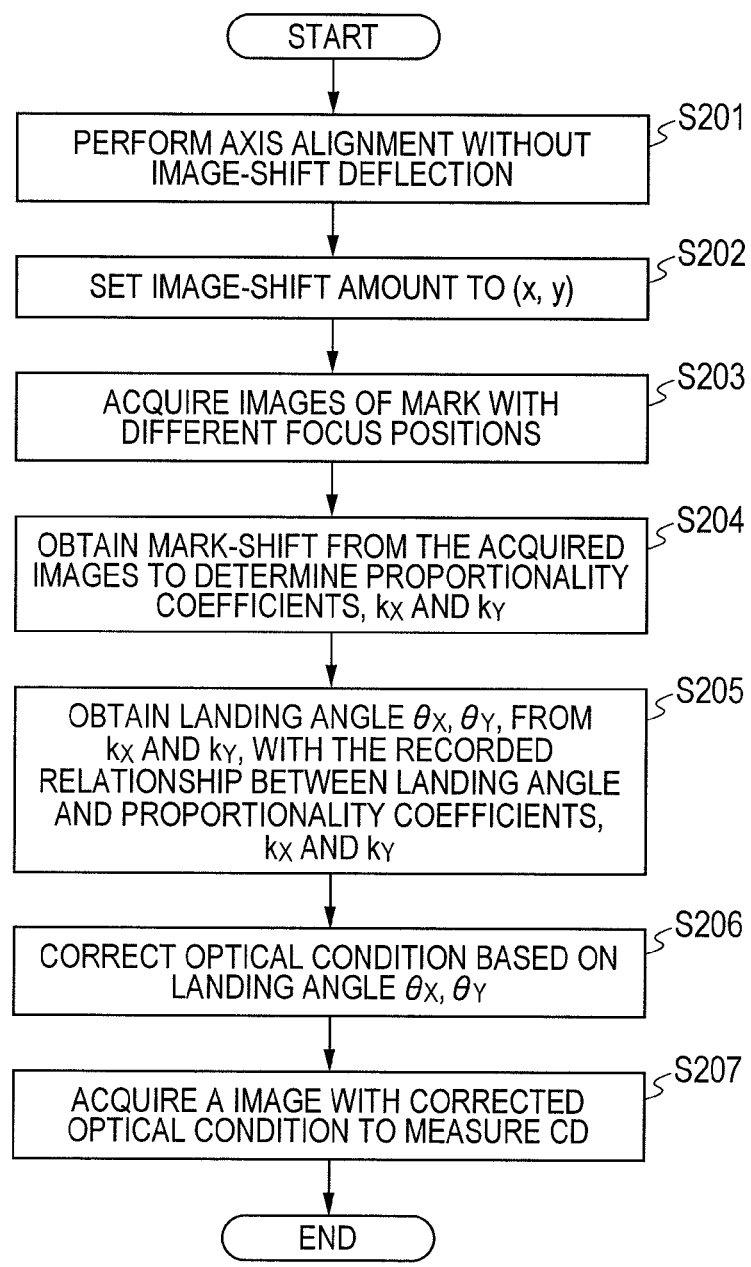
FIG. 2 is a flowchart in measuring and correcting a landing angle using the charged particle instrument according to the first embodiment.

FIG. 2 shows a flowchart of measuring a critical dimension (CD) by acquiring an image by correcting optical conditions of currents or voltages of the deflectors (103, 104, 105) and the objective lens 106, a retarding potential which is applied on the stage 108 and the like by measuring a change in a landing angle in accordance with the image-shift deflection using the electron microscope having the configuration described above. An explanation will be given of respective steps of the flowchart as follows.

First, at step S201, an optical-axis alignment is performed in a state of an image-shift deflection amount of 0. The optical axis alignment is an operation of aligning the trajectory of the primary electron-beam 109 to produce a state where a pattern in an image is not moved in an up and down direction and in a left and right direction even when a focus is changed. By performing the optical axis alignment, a landing angle becomes perpendicular in a state of the image-shift deflection amount 0. Specifically, the operation is performed as follows. An SEM image is displayed on the display device 122 while changing the focus. The focus is changed by changing the control value of the objective lens controller 116 or the retarding potential controller 117. An operator of the instrument adjusts the control value of the alignment deflector controller 113 such that the movement of the pattern in the image is reduced while looking at the SEM image. The focus is changed by changing the control value of the objective lens controller 116 or the retarding potential controller 117. The step can also be performed automatically without a manual operation by the operator of the instrument. In that case, the image which is obtained while changing the focus is recorded to the memory 125, the amount of moving the pattern in accordance with movement of the focus is measured using the operation unit 124, and the control value which is transmitted to the alignment deflector controller 113 is adjusted by the control signal generator 123 in accordance with the movement amount and the direction. The optical axis alignment is generally performed immediately after starting to use the instrument or periodically. Therefore, depending on the state of the instrument, the step S201 may be omitted.

Figures 3, 4, 5:
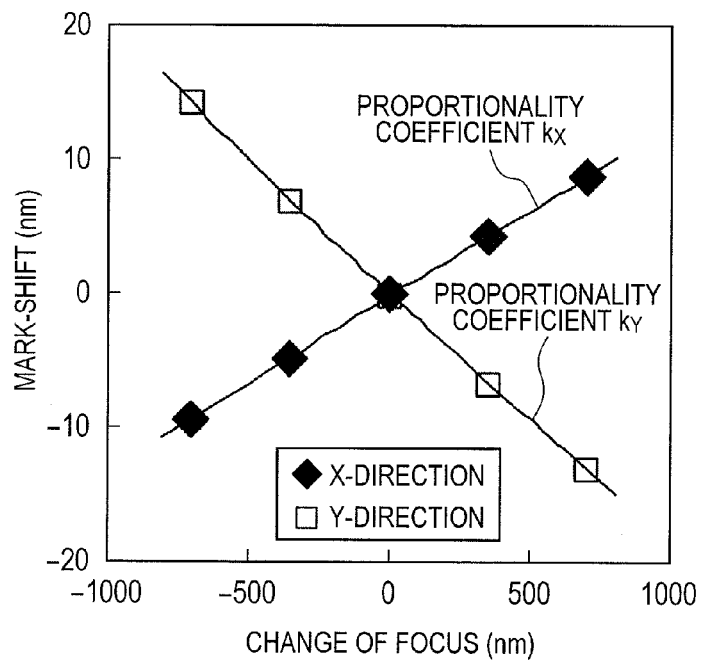
FIG. 3 is an explanatory diagram of the charged particle instrument according to the first through ninth embodiments, and is a table showing an example of a relationship between image-shift amounts as (XY) and a control value of an image-shift deflector.
FIG. 4 is an explanatory diagram of the charged particle instrument according to the first through ninth embodiments, showing a relationship between a mark-shift amount and a change of focus amount for calculating proportionality coefficients kx, ky.
FIG. 5 is an explanatory diagram of the charged particle instrument according to the first through ninth embodiments, and is a table showing an example of a landing angle correction coefficient for each image-acquisition condition.

At step S202, an image-shift deflection amount is set to a prescribed image-shift deflection amount by controlling a current or a voltage which is applied on the image-shift deflector 104 using the image-shift deflector controller 114. Deflection amounts in X-direction and in Y-direction at this occasion are respectively made to be x and y. Ordinarily, a relationship between deflection amounts x and y and image-shift control values ISX and ISY as shown in FIG. 3 is preserved in the image-shift control amount preserving region 127. When the deflection amounts are designated, the operation unit 124 determines the control values based on the relationship that is recorded in the image-shift control amount preserving region 127. The control values are set to the image-shift deflector controller 114 through the control signal generator 123. Incidentally, the relationship may be of a table style as shown in FIG. 3, or may be of a style of an approximation equation of calculating ISX and ISY from x and y.

At step S203, plural sheets of images of the same measurement mark on the sample 107 are acquired in states of different focus positions by changing the focus. The acquired images are preserved in the memory 125. The marks may be two-dimensional so as to be able to detect pattern movement amounts in X and Y directions. Furthermore, when the focus is changed by an amount in a range of about 1 µm, the SEM image is not so much blurred, and a position shift measurement which is performed at succeeding step S204 can be executed accurately.

At step S204, the images which are preserved in the memory 125 are compared with each other and a relative position shift of the mark within the image is calculated by the operation unit 124. As a method of calculating the position shift, an algorithm of detecting the relative movement amount of the pattern within the image such as normalized-cross-correlation method, a phase-only-correlation method or the like can generally be used. After calculating the position shift amount, as shown in FIG. 4, focus change amount dependences of the respective position shift amounts in X-direction and in Y-direction are linearly approximated, and proportionality coefficients kx and ky are calculated. Further, the focus change amount is calculated from the change amount of the control value of the objective lens, or the retarding potential changed at S203 by previously preserving the focus change amount per the control value 1LSB in the focus astigmatism change coefficient preserving region 129.

Steps S205 through S206 are steps of controlling an optical condition on the basis of the position shift amounts calculated at Step S204 and correction coefficients which are registered in the landing angle correction coefficient preserving region 128. Specifically, the steps are as follows.

Step S205 is a step of calculating landing angles θX and θY from kx and ky by the operation unit 124. Here, notations θX and θY respectively designate X component and Y component of an angle from a normal line of the surface of the sample. Calculation equations described below are used for calculating the landing angles.

Equation 1

$$\theta_X = \arctan(k_X + A \cdot x + B \cdot y) \qquad (1)$$

Equation 2

$$\theta_Y = \arctan(k_Y + C \cdot x + D \cdot y) \qquad (2)$$

Here, as shown in FIG. 5, correction coefficients A, B, C, and D are previously recorded in the landing angle correction coefficients preserving region 128 for respective image-acquisition conditions of an accelerating voltage, an optical mode and the like, and are calculated by reading the image-acquisition conditions. The correction coefficients may be recorded by determining the correction coefficients by an experiment, or may be recorded by determining the correction coefficients by a simulation.

When the landing angles are calculated, the optical conditions are corrected such that the landing angles are perpendicular at step S206. Specifically, in a case where the optical conditions are corrected using the alignment deflector 103, the landing angles of the primary electron beam are changed and controlled to be perpendicular by adjusting a current or a voltage that is applied on the alignment deflector 103 by adjusting control values which are transmitted to the alignment deflector controller 113 by the control signal generator 123. An amount of changing the control value of the alignment deflector controller 113 which is necessary for making the landing angle perpendicular is calculated by reading the change amount of the landing angle per control value 1LSB which is previously recorded in the landing angle change coefficient preserving region 130 by the operation unit 124.

Although here, the method of correction using the alignment deflector 103 is described, the correction may be performed using other deflector, or the correction may be performed using two or more of deflectors. For example, the image deflectors are configured by two upper and lower stages, the landing angle can also be changed by changing a deflection center by changing current values applied on the upper and lower deflectors, or a relative strength of the voltage value and the relative rotation-angle.

Finally, at step S207, the image is acquired under the corrected optical condition, the critical dimension is measured using the operation unit 124, and the result and the image are displayed on the display device 122.

Further, depending on the instrument, there is a case where the landing angle does not become perpendicular even when an optical-axis alignment is performed in a state where the image-shift deflection is not used at step S201. In that case, the landing angles θX and θY which are calculated at step S205 do not become angles from the normal line of the sample surface but angles with landing angles of the primary electron-beam in a state where the image-shift deflection is not performed as references. However, changes in landing angles in accordance with image-shift deflection can be reduced by correcting landing angles θX and θY which are measured by performing the flowchart of FIG. 2 to be 0.

By the above-described procedure, a change in the critical dimension value in accordance with image-shift deflection can be reduced, and the wide deflection region and the high CD reproducibility can be made to be compatible with each other. The high throughput measurement can also be performed since the deflection region can be made to be wide.

When CD of lines on a semiconductor substrate is measured by image shift using SEM (charged particle instrument) according to the present embodiment, an excellent result is obtained.

Furthermore, although the change in the focus which is used in the axis alignment at step S201 and the change in the focus at step S203 are ordinarily performed by changing the current value of the objective lens 106 using the objective lens controller 116, the changes in the focus may be performed by changing a potential of the stage 108 using the retarding potential controller 117. In comparison with the case of using the objective lens 106, in the case of using the retarding potential, generally, the correction amount of the landing angle is reduced, an error in accordance with the correction is reduced, and therefore, the landing angle can be measured with higher accuracy. Therefore, the change in the focus by the retarding potential may be regarded as effective. Incidentally, the change in the focus may be performed using means other than these. However, when focus changing means which is used in the axis alignment at step S201 differs from the focus changing means that is used at step S203, there is a case of causing an error in measuring the landing angle. Therefore, it is preferable to use the same focus changing means.

Further, although the explanation has been given by taking the example of the image-shift deflection, a similar procedure is applicable also to deflection using other deflector.

As described above, according to the present embodiment, there can be provided the charged particle instrument which can make the wide deflection region and the high CD reproducibility compatible with each other in shifting the image. Further, the high throughput measurement can be performed.

Second Embodiment

An explanation will be given of a second embodiment in reference to FIG. 6 through FIG. 10. Incidentally, matters which are described in the first embodiment and are not described in the present embodiment are applicable also to the present embodiment so far as there is not a special situation.

Figure 6:
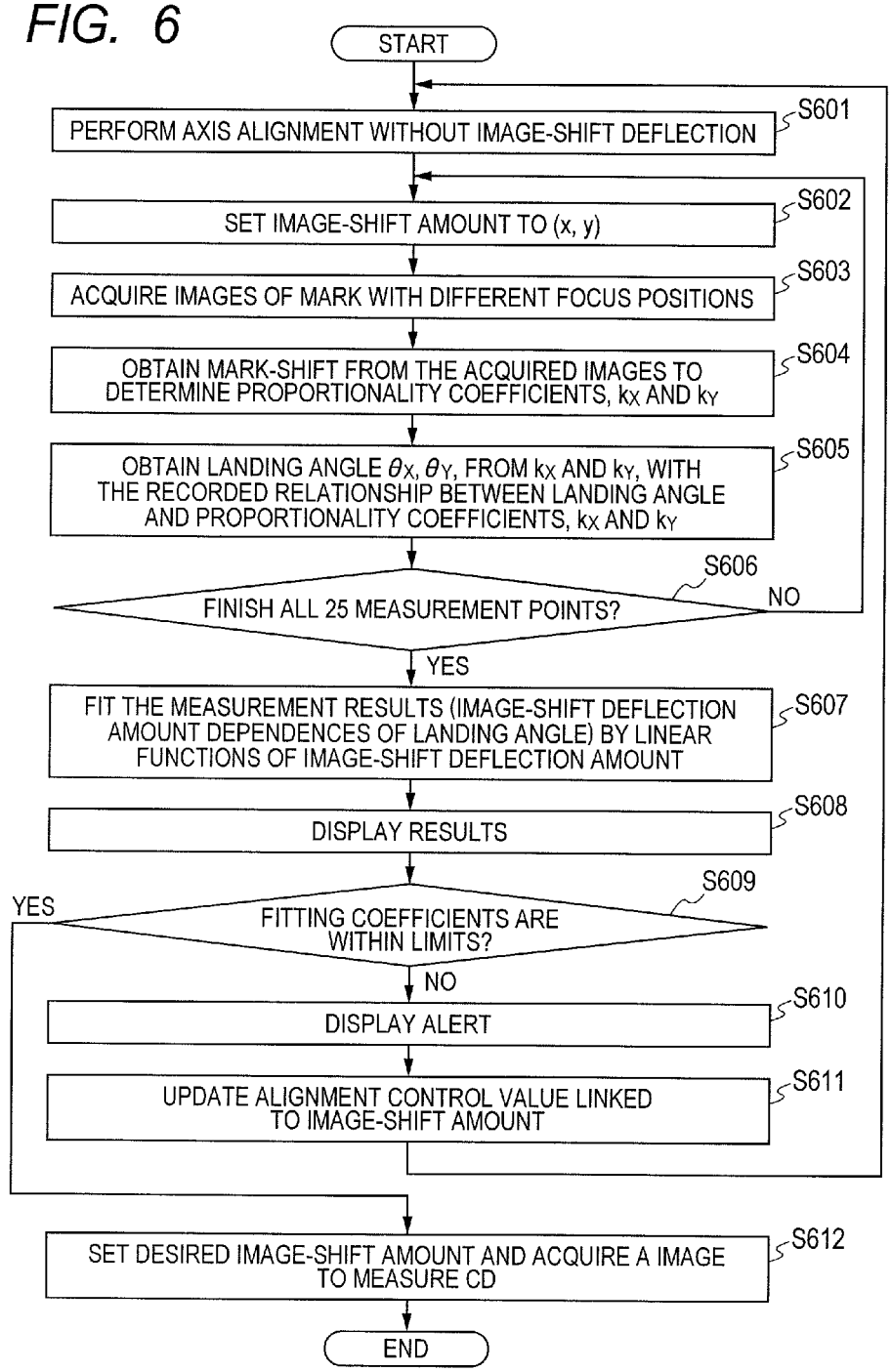
FIG. 6 is a flowchart in measuring and correcting the landing angle using the charged particle instrument according to the second embodiment.

FIG. 6 is a flowchart of other embodiment of measuring the critical dimension by measuring the change in the landing angle in accordance with the image-shift deflection and acquiring an image by correcting the optical condition. According to the present embodiment, in plural different image-shift deflection amounts, plural number of sheets of images having the same mark on the sample are acquired by changing the focus, position shift amounts of the mark are measured in the acquired images, and optical conditions are controlled when images of arbitrary electron beam deflection amounts are acquired on the basis of correction coefficients which are registered in the landing angle correction coefficient preserving region 128. Specifically, the landing angle is corrected by a method described below, an interval between the measured image shift deflection amounts is interpolated by fitting. Thereby, the landing angle is corrected to be perpendicular also in the arbitrary image-shift deflection amount. An explanation will be given in accordance with the flowchart as follows.

First, at step S601, an axis alignment is performed in a state of an image shift deflection amount of 0 similar to step S201. Incidentally, depending on states of the instrument, step S601 may be omitted.

At step S602, similar to step S202, there is controlled a current value or a voltage value which is applied on the image-shift deflector 104 using the image-shift deflector controller 114, and the image shift deflection amount is set to be a prescribed image-shift deflection amount. Deflection amounts in X-direction and in Y-direction at this occasion are respectively made to be x and y. According to the present embodiment, the measurement is performed successively with regard to 25 points of image-shift deflection amounts shown in FIG. 7. Although the more increased the number of measurement points, the more improved the accuracy, the throughput is reduced, and therefore, the number may be increased or reduced as necessary.

In steps S603, S604, and S605, similar to steps S203, S204, and S205, plural sheets of images of a mark are acquired in different focus position states, the proportionality coefficients kx and ky of the mark-position shift amount are calculated from the acquired images, the correction coefficients which are preserved previously in the landing angle correction coefficient preserving region 128 are used, and the landing angles θX and θY are calculated from kx and ky. The calculated landing angles are recorded in the memory 125.

At step S606, it is determined whether the measurement has been finished with regard to 25 points of the all the image-shift deflection amounts using the operation unit 124. When the measurement is not finished, the operation returns to step S602 and the measurement is performed at a next image-shift deflection amount. When the measurement is finished, the operation proceeds to next step S607.

At step S607, fitting is performed for image-shift deflection amount dependences of the landing angles θX and θY which are recorded in the memory 125 by linear functions of image-shift deflection amounts x and y as described below.

Equation 3

$$\tan\theta_X = p\cdot x + q\cdot y \qquad (3)$$

Equation 4

$$\tan\theta_Y = r\cdot x + s\cdot y \qquad (4)$$

Here, notations p, q, r, and s designate fitting parameters which are calculated by the fitting. By the fitting, the image-shift deflection amount dependence of the landing angle can be calculated accurately from individual measurement data including errors. Furthermore, also with regard to an image-shift deflection amount which is not measured, the landing angle can be calculated using equations described above. Incidentally, in this case, there is shown an example of performing the fitting by the linear function by summarizing all the data of 25 points. However, in a case where there is a sufficient number of data points, the fitting may be performed by other function of a quadratic function or the like, or measurement data may be divided into a number of groups, and the fitting may be performed by data of respective groups.

Figures 8A, 8B:
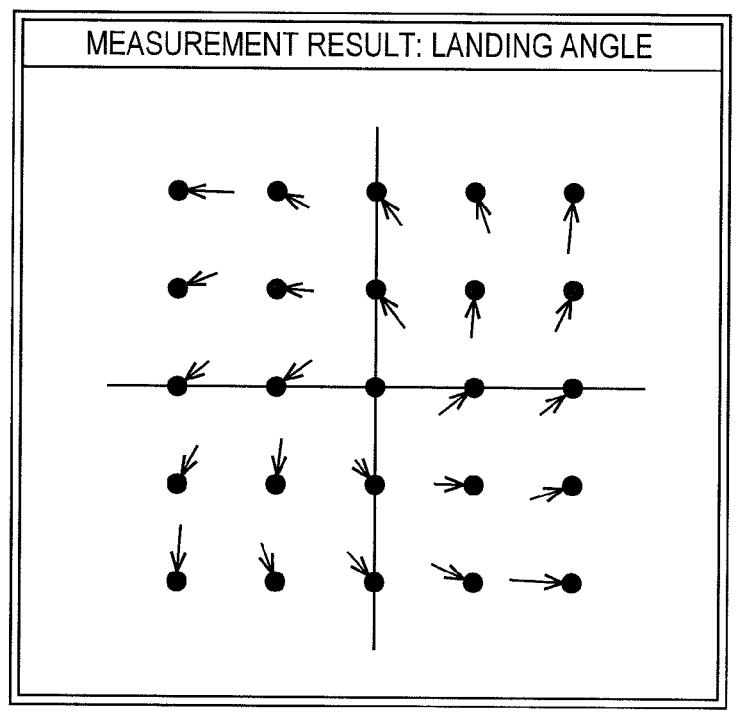
FIGS. 8A and 8B show examples of display screens in the charged particle instrument according to the second embodiment.
Figures 12A, 12B:
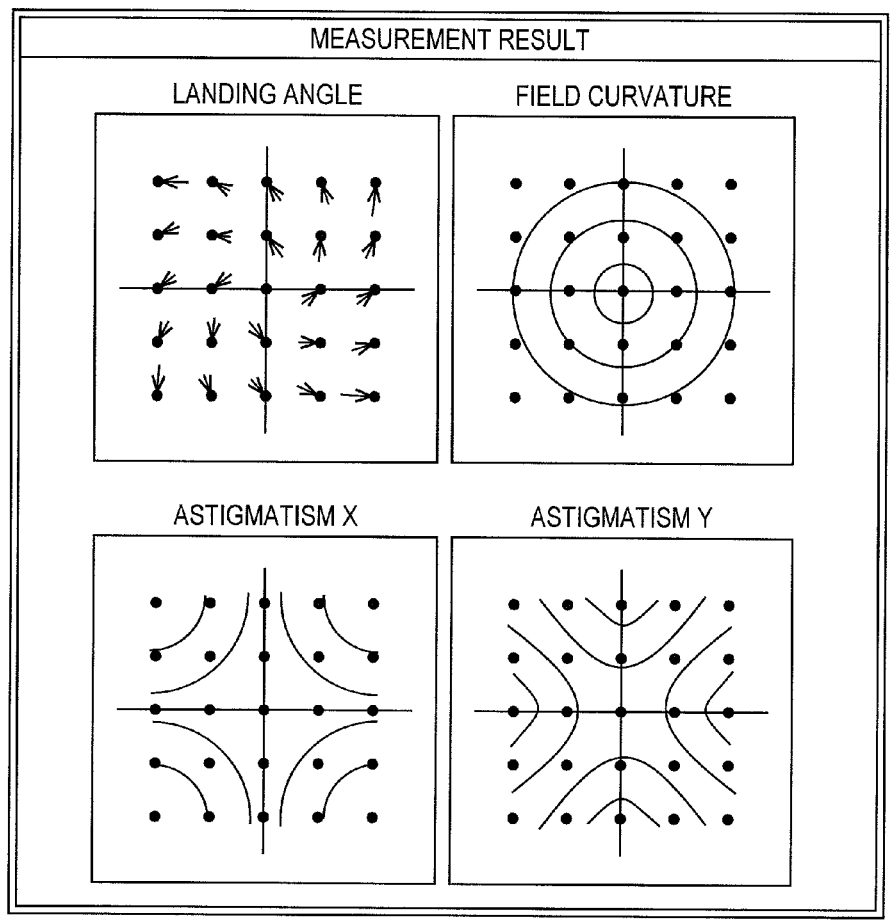
FIGS. 12A and 12B show examples of display screens in the charged particle instrument according to the third embodiment.

At step S608, display data showing a measured result, or a result of the fitting is generated at the display data generating unit 126, and are displayed on the display device 122. The display may be of a style of illustrating the landing angle at each measurement point by an arrow mark type vector as shown in FIG. 8A, or the display may be of a style of displaying the result of fitting at a specific deflection amount by a numerical value as shown in FIG. 8B.

At step S609, it is determined whether a distribution of the landing angles within an image-shift deflection region is uniform from a measured result by the operation unit 124. In a case where any of the parameters p, q, r, and s which are obtained by the fitting falls within a previously designated region, it is determined that the landing angles are sufficiently uniform, the operation proceeds to step S612. On the other hand, when any of p, q, r, and s is deviated from the designated range, it is determined that correction thereof is needed, and the operation proceeds to step S610. Further, although here, the determination is performed by the fitting parameters, as other method, the determination may be carried out by whether a fitting value in a previously determined deflection amount falls within the designated range, or the determination may be performed by whether all of the landing angles measured fall within the designated range.

At step S610, alert display data indicating that the image-shift dependency of the landing angle is not sufficiently uniform are generated at the display data generating unit 126, and displayed on the display device 122. The display may be performed by only informing that the correction is performed as shown in FIG. 9A, or it may be selected by an operator of the instrument whether the correction is carried out by displaying that the correction is needed as shown in FIG. 9B. Or, as shown in FIG. 9C, these displays may be displayed along with the result displayed at step S608. Or, it may be set that the correction is carried out automatically without displaying the alert.

At step S611, optical conditions are corrected using the measurement result. Specifically, an alignment control value linked to the image shift amount is updated. An alignment control linked to the image-shift amount is a function of reading a table as shown in FIG. 10 which is preserved in the alignment control amount linked to the image-shift amount preserving region 131 by the operation unit 124, and finely adjusting a current value, or a control value of the alignment deflector controller 113 in accordance with the image-shift deflection amount by the operation unit 124. The function is used ordinarily for preventing that an axis shift occurs in accordance with the image-shift deflection. However, the landing angle does not become perpendicular in a trajectory in which the axis shift does not occur when the image-shift deflection is used. Hence, according to the present embodiment, the function is not used for preventing the axis shift in accordance with the image-shift deflection but is used for preventing a change in the landing angle in accordance with the image-shift deflection. Specifically, there is calculated an amount of changing the control value of the alignment deflector controller 113 which is needed for making the landing angle perpendicular in each image-shift deflection amount by the operation unit 124, and a new alignment amount is calculated and is recorded again by adding the calculated change amount to a value which has been recorded at the alignment control amount linked to the image-shift preserving region 131. The change amount of the control value of the alignment deflector controller 113 which is needed for making the land-ing angle perpendicular is calculated using the change amount of the landing angle per the control value 1LSB of the alignment deflector 103 by previously preserving the change amount at the landing angle change coefficient preserving region 130.

Thereafter, when the image-shift deflection is performed, the alignment control linked to the image-shift is carried out in accordance with the updated table, and the change in the landing angle by the image-shift deflection is canceled by adjusting the trajectory by the alignment deflector 103. After performing the correction, the operation returns to step S601, the image-shift deflection amount dependence of the landing angle is measured and it is confirmed whether the change in the landing angle is corrected again.

Furthermore, here, there is described the method of correcting the landing angle by updating the correction amount of the correction of the control value of the alignment deflector controller 113 which is carried out by being linked with the image-shift amount, which is recorded in the landing angle change coefficient preserving region 130, the correction may be carried out by changing the landing angle using other deflector, or the correction may be performed using two or more of deflectors. For example, in a case where the image-shift deflectors 104 are configured by two (up and down) stages, the landing angle can also be changed by changing a deflection center by changing a relative strength of currents or voltages which are applied on the up and down deflectors and a relative rotation-angle. In adjusting the trajectory by adjusting the relative strength of the up and down stages and the relative rotation-angle in this way, values are not set individually in accordance with the image-shift deflection amount, but a common value may be set to all of the image-shift deflection amounts.

At step S612, a current value, or a voltage value of the image-shift deflector 104 is set using the image-shift deflector controller 114 similar to step S202 such that a desired image-shift deflection amount is obtained, the image is acquired similar to step S207 to thereby measure the critical dimension. The step is not necessarily needed to perform continuously to steps from S601 to S611, but when the landing angle is finished to be corrected by performing steps from S601 to S611, so far as the state of the optical system is not changed, the critical dimension can be measured by acquiring the image in a state where the primary electron-beam is always landed perpendicularly.

By the procedure described above, the change in the CD value can be reduced by restraining the change in the landing angle in accordance with the image-shift deflection, and the wide deflection region and the high CD reproducibility can be made to be compatible with each other. With the method, the change in the landing angle in accordance with the image-shift deflection can be restrained with regard to an arbitrary image-shift deflection amount by only measuring image-shift deflection amounts of about several tens points.

When CD of lines on a semiconductor substrate is measured by shifting the image using SEM (charged particle instrument) according to the present embodiment, an excellent result is obtained.

In addition, similar to the first embodiment, although the change in the focus which is used in the axis alignment at step S601 and the change in the focus at step S603 are ordinarily performed by changing the current value of the objective lens 106 using the objective lens controller 116, the changes may be performed by changing the potential of the stage 108 using the retarding potential control portion 117, or other means. In comparison with the case of using the objective lens, in the case of using the retarding potential, generally, the correction amount of the landing angle is reduced, an error in accordance with the correction is reduced, and therefore, the landing angle can be measured with higher accuracy.

Incidentally, although here, the explanation has been given by taking the example of the image-shift deflection, a similar procedure is applicable also with regard to deflection using other deflector.

As described above, according to the present embodiment, an effect similar to that of the first embodiment is obtained. In addition, by measuring image-shift deflection amounts of about several tens points, the change in the landing angle in accordance with the image-shift deflection can be restrained at an arbitrary position.

Third Embodiment

An explanation will be given of a third embodiment in reference to FIG. 11 through FIG. 14. Incidentally, matters which are described in the first embodiment or the second embodiment and which are not described in the present embodiment are applicable also to the present embodiment so far as there is not a special situation.

FIG. 11 is a flowchart of the embodiment of measuring field curvature and astigmatism using an image which measures a change in a landing angle in accordance with an image-shift deflection, and measuring a critical dimension (CD) by correcting an optical condition and acquiring an image based thereon. The embodiment adds measurement and correction of field curvature and astigmatism to the second embodiment, and the other portion is the same as the second embodiment. Here, an explanation will be given in reference to the flowchart of FIG. 11 of a different portion in comparison with the flowchart of FIG. 6. Incidentally, although the present embodiment shows an example of carrying out measurement and correction of both of field curvature and astigmatism, either one of field curvature and astigmatism will do.

Steps S1101 through S1105 are similar to steps S601 through S605.

At step S1106, with regard to plural images which are preserved in the memory 125 at step S1103, an image sharpness is measured by the operation unit 124, a focus which maximizes the image sharpness is calculated from a relationship between a change in the focus and the image sharpness, field curvature f is calculated, and preserved in the memory 125. Further, with regard to the same plural images, image sharpness in respective direction of the images are measured, a shift by the direction of the focus position which maximizes the image sharpness is calculated from the relationship between the change in the focus and the image sharpness, and astigmatism ax and ay are calculated, and preserved in the memory 125. Notation ax designates astigmatism which is generated between in 0° direction (up and down direction) of an SEM image and in 90° direction (left and right direction) thereof, and notation ay designates astigmatism which is generated between in 45° direction (right up and left down direction) and in 135° direction (right down left up direction). Naturally, ax and ay may also be defined as astigmatisms in any directions so far as the directions are shifted from each other by 45° degrees. Algorithms of measuring field curvature and astigmatism are publicly known, and a method described in, for example, Japanese Patent No. 4286625, etc. may be used.

Steps S1107 and S1108 are similar to steps S606 and S607.

At step S1109, with regard to image-shift deflection amount dependences of field curvature f and astigmatisms ax and ay which are preserved in the memory 125 at step S1106, by the operation unit 124, fittings are carried out by a function of an image-shift deflection amount described below.

Equation 5

$$f = t \cdot (x^2 + y^2)^{1/2} \quad (5)$$

Equation 6

$$a_x = u \cdot \cos(\arctan(x/y) + \phi)(x^2 + y^2)^{1/2} \quad (6)$$

Equation 7

$$a_y = u \cdot \sin(\arctan(x/y) + \phi)(x^2 + y^2)^{1/2} \quad (7)$$

Here, notations t, u, and φ designate fitting parameters which are calculated by fitting. By the fitting, the image-shift deflection amount dependences of field curvature and astigmatism can accurately be calculated from individual measured data including an error. Further, also with regard to image-shift deflection amounts which are not measured, using the equations described above, field curvature and astigmatism can be calculated. Incidentally, although here, there is shown an example of carrying out the fitting by summarizing data of all of 25 points, in a case where there is a sufficient number of pieces of data, measurement data may be divided into a number of groups, and fitting may be carried out for data of the respective groups. Further, fitting may be carried out by a function other than the function shown here.

At step S1110, display data indicating a result obtained at steps S1108 and S1109, or a result of fitting is generated by the data generator 126, and displayed on the display device 122. The display may be of a style of illustrating the landing angle at each measurement point by a vector of an arrow mark type as in FIG. 12A, and illustrating field curvature and astigmatism by contours, or may be of a style of displaying a fitting result at a specific deflection amount by a numerical value as in FIG. 12B.

At step S1111, it is determined by the operation unit 124 whether the change in the landing angle, the field curvature and the astigmatism in accordance with the measured image-shift deflection are within previously determined ranges. In a case where any of parameters p, q, r, s, t, and u obtained by the fitting is within the previously determined range, it is determined that the change in the landing angle, the field curvature, and the astigmatism in accordance with the image-shift deflection are sufficiently small, and the operation proceeds step S1115. On the other hand, in a case where any of p, q, r, s, t, and u is deviated from the designated range, it is determined that correction is needed and the operation proceeds to step S1112. Incidentally, although here, the determination is carried out by the fitting parameter, as other method, it may be determined whether a fitting value by a previously determined deflection amount is within a designated range, or the determination may be carried out by whether all of data of the landing angle, the field curvature, and the astigmatism measured fall within the designated ranges.

At step S1112, the display data indicating that the image-shift dependences of the landing angle, the field curvature and the astigmatism are not sufficiently uniform is generated by the display data generator 126, and is displayed on the display device 122. The display may only be a notification that correction is carried out as in FIG. 13A, or may be a display that correction is needed and an operator of the instrument may select whether correction is executed as in FIG. 13B. Or, as in FIG. 13C, the display may be displayed along with a result displayed at step S1115, and the operator of the instrument may select whether correction is executed. Or, it may be set that correction is carried out automatically without displaying alert.

Step S1113 is similar to step S611.

At step S1114, control values of the focus and the astigmatism linked to the image-shift amount are updated using the measurement result. The focus control and astigmatism control linked to the image shift amount are functions of reading a table as shown in FIG. 14 which is preserved in the focus astigmatism control amount linked to the image shift amount preserving region 132 by the operation unit 124, and finely adjusting control values of the objective lens controller 116 and the astigmatism corrector controller 112 in accordance with the image-shift deflection amount. The control values are updated specifically as follows. In the respective image-shift deflection amounts, by the operation unit 124, the change amount of the control value of the objective lens controller 116 which is needed for correcting the field curvature and the change amount of the control value of the astigmatism corrector controller 112 which is needed for correcting the astigmatism are calculated, and a new adjustment amount is calculated and recorded again by adding the calculated change amount to a value which is preserved in the focus astigmatism control amount linked to the image shift preserving region 132. The change amounts of the control values which are necessary for correcting the field curvature and astigmatism are calculated by preserving the focus change amount and the astigmatism change amount per the control value 1LSB of the object lens controller 116 and the astigmatism corrector controller 112 previously at the focus astigmatism change coefficient preserving region 129 and reading and using these by the operation unit 124.

Thereafter, when the image-shift deflection is carried out, the focus astigmatism control linked to the image shift is carried out in accordance with the updated table, the field curvature is canceled by a change in a current value of the objective lens 106 and the astigmatism is canceled by a change in a current value of the astigmatism corrector 102. After carrying out the correction, the operation returns to step S1101, measures the landing angle, field curvature, and astigmatism again and confirms whether correction is carried out.

Although here, there is shown the example of carrying out all of the corrections of the landing angle, the field curvature, and the astigmatism, determinations may be carried out respectively separately at step S1111, the alert may be displayed only of a necessary item at step S1112, and only necessary correction may be carried out in steps S1113 and S1114.

Step S1115 is similar to step S612.

Further, similar to the first embodiment, means for changing the focus in the present embodiment may be carried out by a method of changing the potential of the stage 108 using the retarding potential controller 117, or other means.

By the above-described procedure, the change in CD can be reduced by restraining the change in the landing angle, the field curvature, and the astigmatism in accordance with the image-shift deflection, and the wide deflection region and the high CD reproducibility can be made compatible with each other. According to the method, the landing angle, the field curvature, and the astigmatism can be measured and corrected using the same image, and throughput can be increased in comparison with that of the case of carrying out measurements and corrections separately from each other.

When CD of lines on a semiconductor substrate is measured by image shift using the SEM (charged particle instrument) according to the present embodiment, an excellent result is achieved.

As described above, according to the present embodiment, an effect similar to that of the second embodiment is obtained. Further, by measuring and correcting the field curvature and astigmatism, the CD reproducibility can further be promoted.

Fourth Embodiment

An explanation will be given of a fourth embodiment in reference to FIG. 15 through FIG. 17. Incidentally, matters which are described in any of the first through the third embodiments and which are not described in the present embodiment are applicable also to the present embodiment so far as there is not a special situation.

Figure 15:
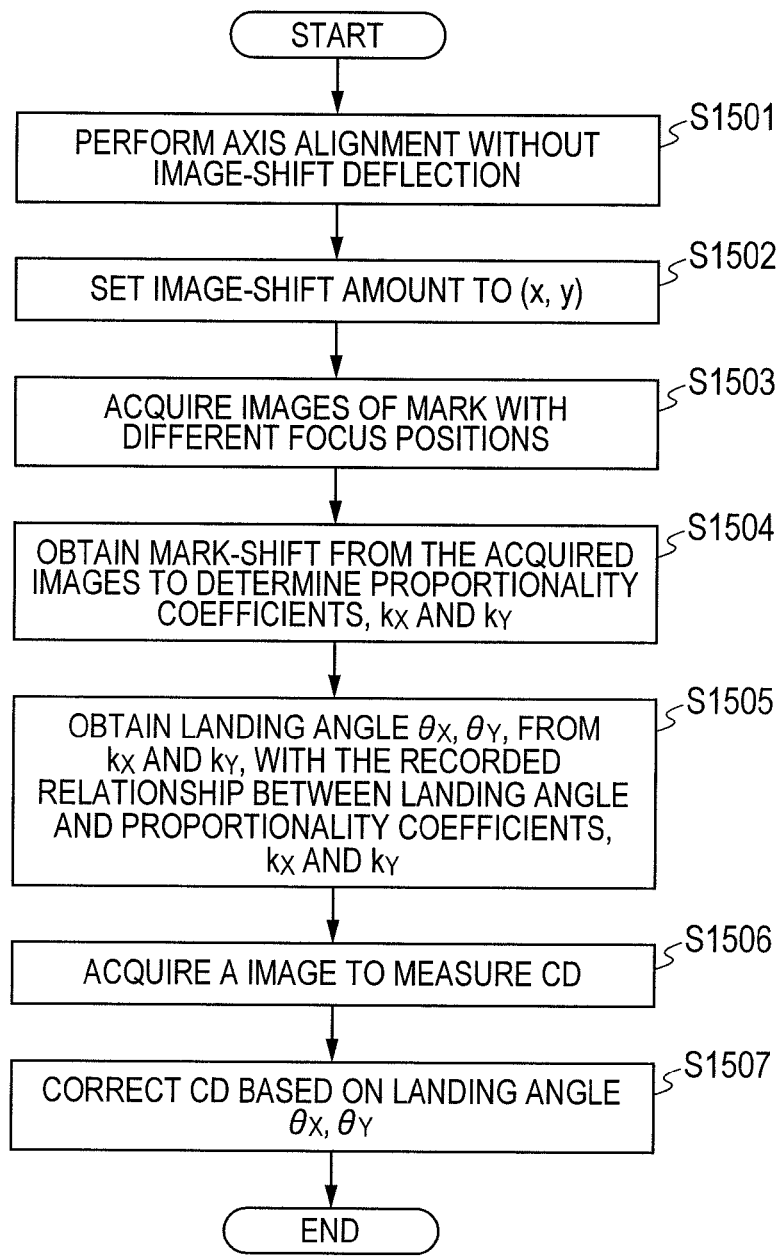
FIG. 15 is a flowchart in measuring the landing angle and correcting CD using the charged particle instrument according to the fourth embodiment.

FIG. 15 shows a modified example of the first embodiment and is a flowchart of an embodiment of correcting a measured CD value when CD of a fine pattern which is formed on a sample by acquiring a plural number of sheets of images of the same mark on the sample by changing the focus and acquiring an image at a prescribed electron beam deflection amount on the basis of the positional shift amounts of the mark in the acquired images and correction coefficients which are registered at the landing angle correction coefficient preserving region 128. That is, this is the flowchart of the embodiment of carrying out a correction for a measured CD value in accordance with the measured landing angle by only measuring the landing angle without the correction.

Although steps S1501 through S1505 are similar to steps S201 through S205 of FIG. 2, at step S1506, an image is acquired without carrying out a correction of the landing angle, CD is measured by the operation unit 124, and a result thereof is recorded to the memory 125.

Thereafter, at step S1507, by the operation unit 124, the landing angle which is measured and recorded to the memory 125 at step S1505 is read, and a measured CD value is corrected. For example, in a case where a sectional shape of a pattern is already known, a relationship between a landing angle of a primary electron-beam and a measured CD value is previously calculated using an electron-scattering simulation. A table as shown in FIG. 16 is preserved in the dimension correction value preserving region 133. A landing angle θ in a direction orthogonal to a direction in which CD is intended to measure is calculated from the landing angle which is calculated at step S1505. A measured CD value which is recorded in the memory 125 at step S1506 is corrected in reference to the table.

Figures 16, 17:
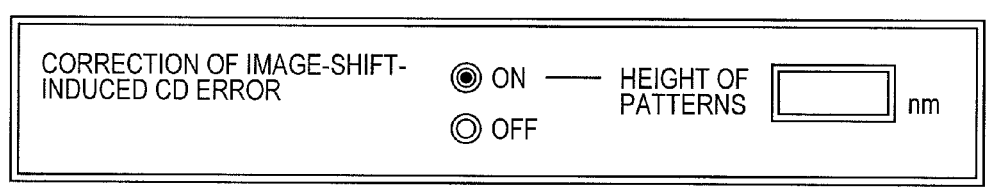
FIG. 16 is an explanatory diagram of the charged particle instrument according to the fourth embodiment, and is a table showing an example of a CD correction value in accordance with the landing angle.
FIG. 17 shows an example of a display screen in the charged particle instrument according to the fourth embodiment.

Or, a display data of an input dialog shown in FIG. 17 may be generated by the display data generator 126 and displayed on the display device 122, a height h of a pattern may be made to be inputted by the instrument operator, and a CD correction value ΔCD may be determined in accordance with Equation (8).

Equation 8

$$\Delta CD = -h \cdot |\tan \theta| \tag{8}$$

Further, although here, a description has been given of a case of only one point of an image-shift deflection amount, a measured CD value can also be corrected by measuring landing angles by plural image-shift deflection amounts, calculating a landing angle for an arbitrary image-shift deflection amount by fitting a result of the measurement as in the second embodiment, thereafter, when the image-shift deflection is used, referring to the table shown in FIG. 16, or using Equation (8).

Furthermore, the measured CD value can also be corrected by measuring not only the landing angle but field curvature and astigmatism as in the third embodiment, forming tables similar to the table of FIG. 16 for field curvature and astigmatism and preserving the tables at the record device 120 and corresponding to the measured landing angle, field curvature, and astigmatism.

By a procedure described above, a change in a measured CD value in accordance with the image-shift deflection can be reduced, and the wide deflection region and the high CD reproducibility can be made compatible with each other. According to the method, it is not necessary to correct the landing angle, field curvature, and astigmatism by changing the optical condition. Therefore, an operation unit of calculating a correction amount of a control value is dispensed with and hardware and software of the instrument can be simplified, further, a procedure of carrying out correction can be omitted, and therefore, the throughput can be increased.

When CD of lines on a semiconductor substrate is measured by shifting an image using SEM (charged particle instrument) according to the present embodiment, an excellent result is achieved.

As described above, according to the present embodiment, an effect similar to that of the third embodiment is achieved. Also, other than the landing angle of the primary charged particle beam is not actually corrected, and therefore, the higher throughput measurement can be performed.

Fifth Embodiment

Figure 18:
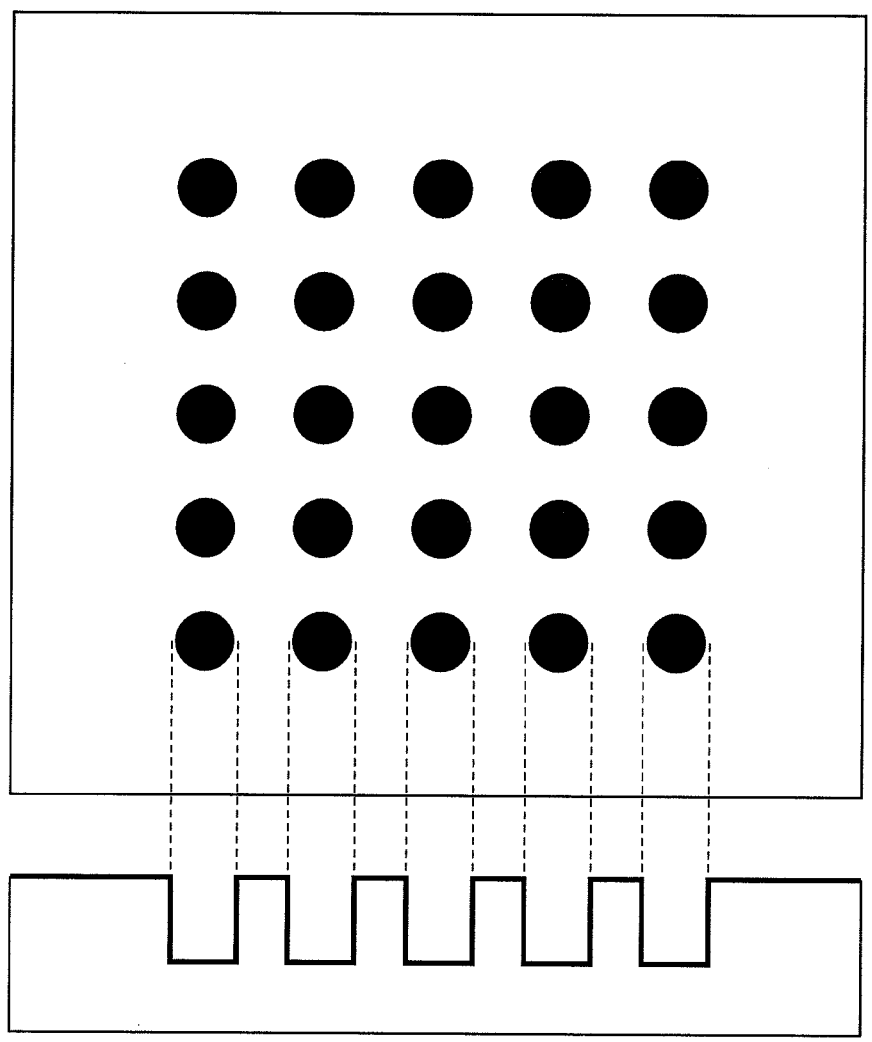
FIG. 18 is a schematic view showing a measurement mark used in the charged particle instrument according to the fifth embodiment.

An explanation will be given of a fifth embodiment in reference to FIG. 18. FIG. 18 is a schematic view showing a mark for measurement which is used in the charged particle instrument according to the present embodiment. By using a micro-hole array as shown in FIG. 18 as a mark for measurement in the first through fourth embodiments, landing angle, field curvature, and astigmatism can be measured with high measurement accuracy. As a result thereof, in comparison with the case of using other mark, a change in a measured CD value in accordance with deflection of a primary electron-beam can further be reduced. Or, an equivalent effect can be achieved by a smaller number of sheets of acquiring an image.

When the mark configured by small holes is used, most of secondary electrons which are emitted from a hole bottom impinge on a side wall of the hole and are not detected by the detector 119. Therefore, detected signals are substantially only signals from a top face of a sample. There is resolved a deterioration in an accuracy of measuring field curvature or astigmatism which is problematic in a sample having a height such as a pyramid sample. In addition, signals of secondary electrons from the hole bottom are not substantially detected. Therefore, a contrast of signals between the hole portion and the other portion is increased, and there is achieved an advantage of capable of acquiring an SEM image having high S/N. Also, a number of edges are present isotropically in the hole array pattern. Therefore, the hole array pattern is suitable for measuring astigmatism which needs to detect a two-dimensional pattern moving amount and measure a direction-dependent image sharpness.

By the arraying, a length of an edge is prolonged, as a result thereof, there can be increased measurement accuracies of both of image sharpnesses and positional shift measurement for measuring the landing angle and for measuring field curvature and astigmatism.

A dimension of the mark suitable for being used in the present embodiment is configured by an array of a total of about 25 pieces of holes in vertical and horizontal five lines having, for example, a hole depth of about 100 nm, a hole diameter of about 50 nm, and a pitch of about 100 nm.

As is apparent from the present embodiment, using the present invention, the landing angle, the field curvature, and the astigmatism of the same sample can be measured with high accuracy, a number of sheets of taking images which is necessary for achieving the same accuracy can be reduced, and the throughput of measurement and correction can be promoted. By correcting the optical condition with high accuracy, a change in the measured CD value in accordance with the image-shift deflection is reduced, and the wide deflection region and the high CD reproducibility can be compatible with each other.

When CD of lines on a semiconductor substrate is measured in shifting an image using SEM (charge particle instrument) shown in FIG. 1 and the mark for measurement shown in FIG. 18, an excellent result is achieved.

As described above, according to the present embodiment, in shifting an image, there can be provided a charge particle instrument which can make the wide deflection region and the high CD reproducibility compatible with each other. Further, using the micro hole-array of the small holes as the mark for measurement, the measurement accuracy can further be improved.

Sixth Embodiment

An explanation will be given as follows of a sixth embodiment. According to the present embodiment, a beam diameter of a primary electron-beam is calculated from images which are acquired in plural different electron beam deflection amounts along with measurement of landing angle, field curvature, and astigmatism in first through fifth embodiments. The beam diameter may be calculated using an image sharpness. The micro-hole array can be formed by subjecting a silicon substrate to dry etching. A way of calculating the beam diameter which is calculated at this occasion differs in accordance with presence or absence of field curvature correction or astigmatism correction. For example, in a case where field curvature or astigmatism is not corrected, the beam diameter is calculated from an image without a change in the focus, and in a case where field curvature or astigmatism is corrected, a beam diameter in optimum focus correction or optimum astigmatism correction is calculated by predicting the beam diameter from an image at a vicinity thereof.

Thereby, a deflection chromatic aberration or coma aberration can periodically be measured. By periodically carrying out the measurement, aging changes in the aberrations can be monitored. Further, a difference among instruments of the aberrations can be grasped by carrying out the measurement with regard to different instruments, and a difference among respective instruments used in inspection can be reduced. Further, the measurement is useful in pursuit of a cause in a case where an aging change occurs in a measured CD value, or in a case where a difference among instrument occurs.

When CD of lines on a semiconductor substrate is measured by shifting an image using SEM (charge particle instrument) shown in FIG. 1, an excellent result is achieved.

As described above, according to the present embodiment, there can be provided the charged particle instrument which can make the wide deflection region and the high dimension CD reproducibility compatible with each other in shifting an image. In addition, by calculating the beam diameter of the primary electron-beam, deflection chromatic aberration or coma aberration can quantitatively be measured. Furthermore, by periodically measuring the aberrations with regard to plural charged particle instruments, the difference among instruments can be reduced.

Seventh Embodiment

Figures 19, 20:
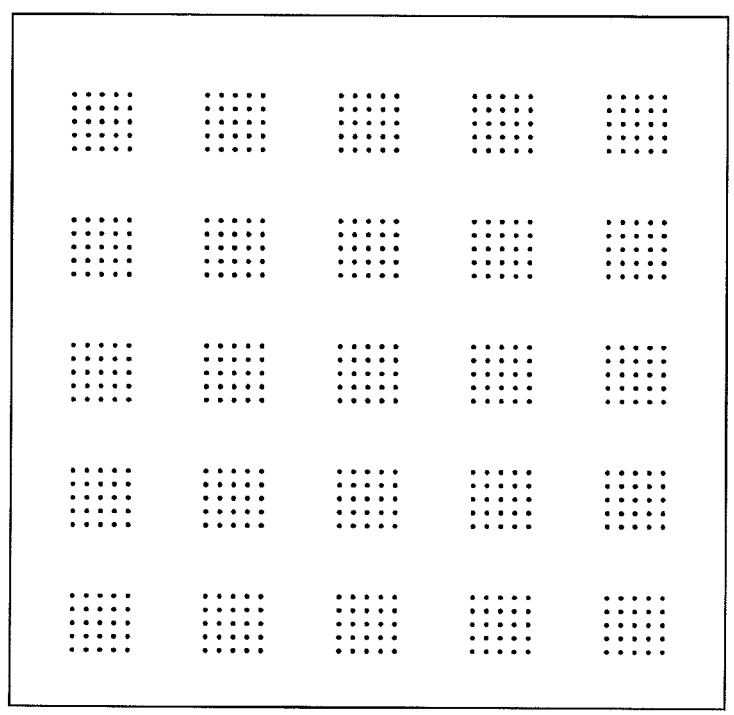
FIG. 19 is a schematic view showing a measurement mark used in the charge particle instrument according to the seventh embodiment.
FIG. 20 shows an example of a display screen in the charged particle instrument according to the eighth embodiment.

An explanation will be given of a seventh embodiment in reference to FIG. 19. Incidentally, matters which are described in any of the first through the sixth embodiments and which are not described in the present embodiment are applicable also to the present embodiment so far as there is not a special situation. FIG. 19 is a schematic view showing marks for measurement which are used in the charged particle instrument according to the present embodiment. According to the present embodiment, there is used a sample in which marks are arranged in a lattice shape on the surface of the sample as shown in, for example, FIG. 19. By setting points of measuring image-shift deflection amounts in the second embodiment or the third embodiment similar to an arrangement of the marks, a distortion is calculated from images which are acquired in plural different electron beam deflection amounts along with measurement of landing angle, field curvature, and astigmatism. A way of calculating the distortion which is calculated at this occasion differs in accordance with presence or absence of field curvature correction or astigmatism correction. For example, in a case where field curvature correction or astigmatism correction is not carried out, the distortion is calculated from an image without a change in the focus, and in a case where field curvature or astigmatism correction is carried out, a distortion in an optimum focus correction or an optimum astigmatism correction is calculated by predicting the distortion from an image at a vicinity thereof. Thereafter, when an image of an arbitrary electron beam deflection amount is acquired, an optical condition is controlled based on the calculated distortion. Publicly-known methods may be used for measurement of the distortion and a correction algorithm.

Thereby, landing angle, field curvature, astigmatism, and distortion can be corrected. According to the method, landing angle, field curvature, astigmatism, and distortion can be measured and corrected using the same image, and the throughput can be increased in comparison with the case of carrying out the measurement and the correction respectively separately.

When CD of lines on a semiconductor substrate is measured by shifting an image using SEM (charged particle instrument) shown in FIG. 1, an excellent result is achieved.

As described above, according to the present embodiment, there can be provided the charged particle instrument which can make the wide deflection region and the CD reproducibility compatible with each other in shifting an image. Furthermore, by making respective single marks arranged in the lattice shape to be a mark in the lattice shape, landing angle, field curvature, astigmatism, and distortion can be measured and corrected using the same image. Thereby, the high throughput measurement can be carried out in comparison with individual measurements and corrections.

Eighth Embodiment

An explanation will be given of an eighth embodiment in reference to FIG. 20. According to the present embodiment, any of the first through the seventh embodiments is carried out periodically. A dialog as shown in FIG. 20 is displayed on the display device 122, it is selected by the instrument operator whether corrections of the first embodiment through the seventh embodiment are carried out periodically. At this occasion, a frequency of the scheduled correction or the like may be enabled to be designated. Or, any of the first through the seventh embodiments may be carried out periodically at a previously set frequency automatically without displaying the dialog of FIG. 20.

Thereby, a change in a measured CD value in accordance with image-shift deflection can be reduced, and a state where the wide deflection and the high CD reproducibility are compatible with each other can be maintained without putting a burden on the instrument operator.

When CD of lines on a semiconductor substrate is measured by shifting an image using SEM (charged particle instrument) shown in FIG. 1, an excellent result is achieved.

As described above, according to the present embodiment, there can be provided the charged particle instrument which can make the wide deflection region and the high CD reproducibility compatible with each other in shifting an image. Further, a change in a measured CD value can simply and conveniently be reduced by periodically measuring and correcting the landing angle and the various kinds of aberrations automatically.

Ninth Embodiment

Figure 21:
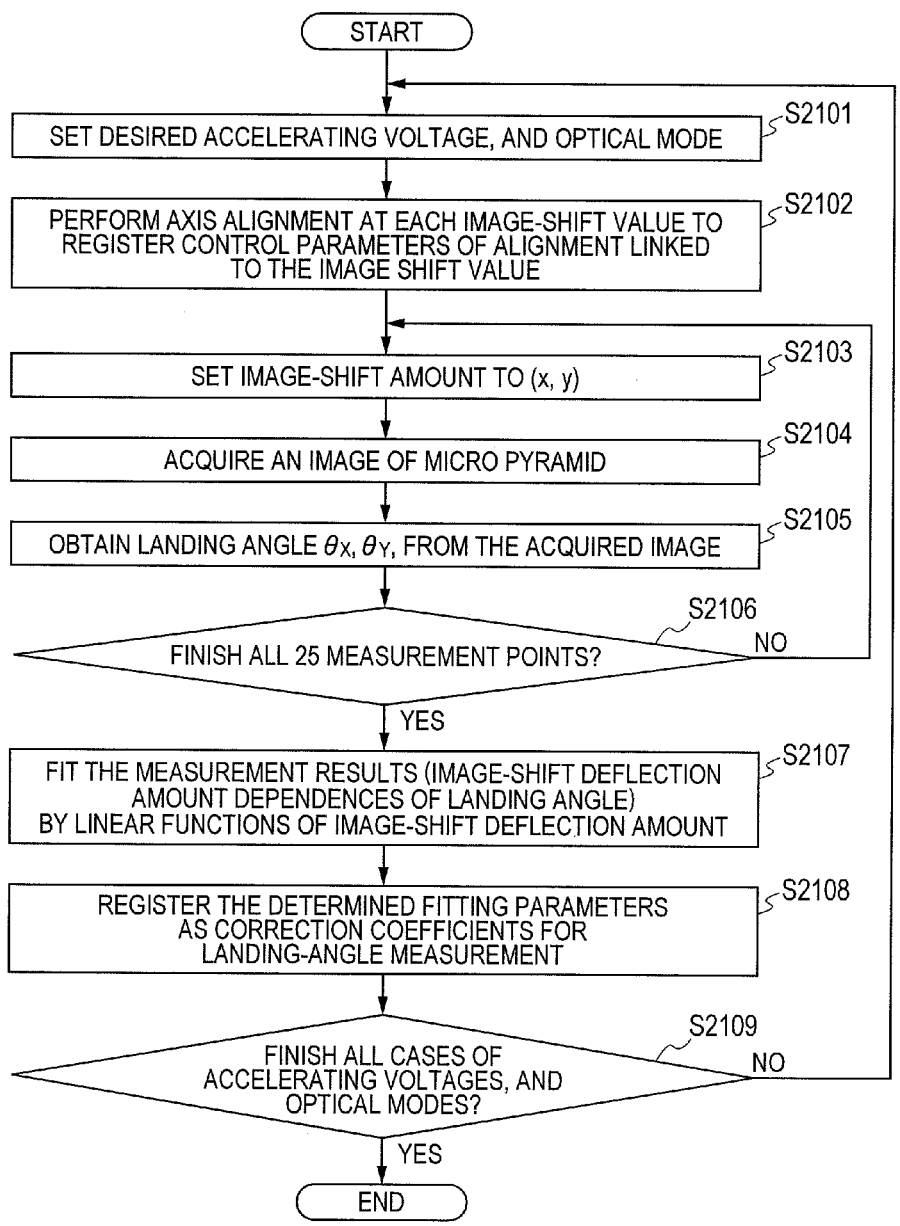
FIG. 21 is a flowchart in correcting a landing angle correction coefficient using the charged particle instrument according to the ninth embodiment.
Figure 22:
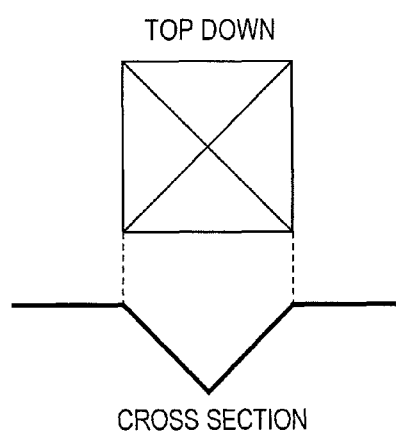
FIG. 22 is a schematic view showing an example of a measurement mark used in the charged particle instrument according to the ninth embodiment.

An explanation will be given of a ninth embodiment in reference to FIG. 21 through FIG. 23. FIG. 21 is a flowchart of an embodiment of calibrating the correction coefficients A, B, C, and D (FIG. 5) which are used in the first through the eighth embodiments. In plural different electron beam deflection amounts, an image of a mark a three-dimensional shape on a sample of which is already known are acquired, the landing angle of the primary electron beam is calculated from a shape pattern of the acquired image, and a coefficient which is calculated from the relationship between the electron beam deflection amount and the calculated landing angle is registered in the landing angle correction coefficient preserving region 128 of the recorder 120. Specifically, the landing angle is measured using a pyramid mark as shown in FIG. 22 as a reference. Naturally, a mark is not to be limited to the pyramid mark but any mark can generally be used so far as the mark is a mark having a three-dimensional structure already known. An explanation will be given in reference to the flowchart as follows.

At step S2101, control signals are transmitted to respective control units by the control signal generator 123, and an image taking condition (accelerating voltage, optical mode or the like) of carrying out calibration is set. When the calibration is carried out under plural image taking conditions, steps S2101 through S2108 are repeated.

At step S2102, in each image-shift deflection amount, the axis alignment which is explained in the second embodiment is performed to register to a correction table (FIG. 10) which is preserved in a preserving region 131 of control parameters of alignment linked to the image shift amount such that even when image-shift deflection is used, an axis shift does not occur.

Figure 7:
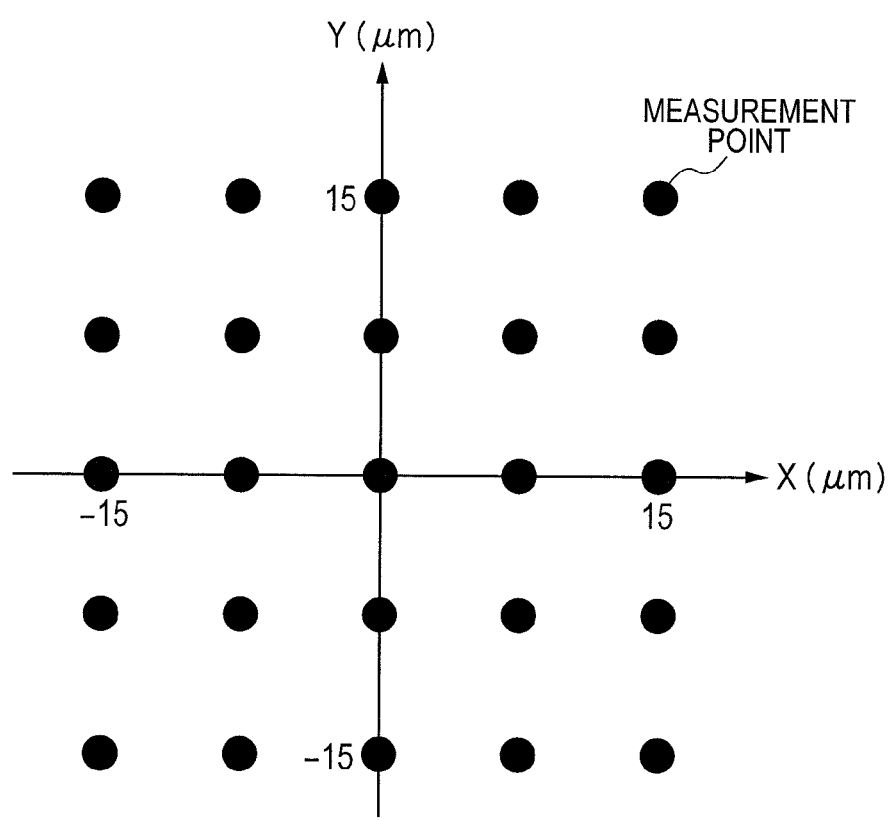
FIG. 7 is an explanatory diagram of the charged particle instrument according to the second embodiment, and is a diagram showing image-shift amounts for performing measurement by dots.

At step S2103, similar to step S202, a current value or a voltage value which is applied on the image-shift deflector 104 is controlled using the image-shift deflector controller 114, and a prescribed image-shift deflection amount is set. Deflection amounts in X-direction and Y-direction at this occasion are respectively made to be x and y. Although according to the present embodiment, the measurement is performed successively with regard to 25 points of image-shift deflection amounts as shown in FIG. 7, the number of measurement points may be added or reduced.

At step S2104, an image of a mark of a micro pyramid is acquired, and is preserved in the memory 125. Incidentally, when an SEM image is acquired at the image-shift deflection amount which is set at step S2103, by corresponding an arrangement of the pyramid mark on the sample and the set image-shift deflection amount such that pyramid mark is precisely disposed in the image, it is not necessary to align the position of the pyramid mark at a primary electron-beam irradiation position by moving the stage 108, and the operation can be performed simply and conveniently.

At step S2105, landing angles θX and θY are obtained by the operation unit 124 using the image which is preserved to the memory 125 at step S2104, and are recorded to the memory 125. At this occasion, a publicly-known algorithm may be used. The landing angle calculated here becomes a landing angle of an axis alignment trajectory.

At step S2106, similar to step S606, it is determined whether the measurement has been finished with regard to all of the image-shift deflection amounts of 25 points. When the measurement is not finished, the operation proceeds back to step S2103, and measurement at a successive image-shift deflection amount is performed. When the operation has been finished, the operation proceeds to next step S2107.

At step S2107, the measurement result is fit by linear functions of image-shift deflection amounts x and y described below by the operation unit 124 for image-shift dependences of the landing angles θX and θY which are recorded in the memory 125.

Equation 9

$$\tan \theta_X = \alpha \cdot x + \beta \cdot y \tag{9}$$

Equation 10

$$\tan \theta_Y = \gamma \cdot x + \delta \cdot y \tag{10}$$

Here, notations α, β, γ, and δ designate fitting parameters which are calculated by fitting.

At step S2108, the calculated fitting parameters α, β, γ, and δ are made to be respective new correction coefficients A, B, C, and D (FIG. 5) and preserved in the landing angle correction coefficient preserving region 128 using the operation unit 124.

At step S2109, it is determined whether all of calibrations have been finished with regard to the image taking conditions (accelerating voltage, optical mode and the like) which needs calibration by the operation unit 124. When the calibration has not been finished, the operation proceeds back to step S2101 and carries out calibration with regard to next image taking condition.

By performing the flowchart described above, the correction coefficients A, B, C, and D can be calibrated, and an accuracy of measuring the landing angle in the first through the eighth embodiments can be ensured.

Figure 23:
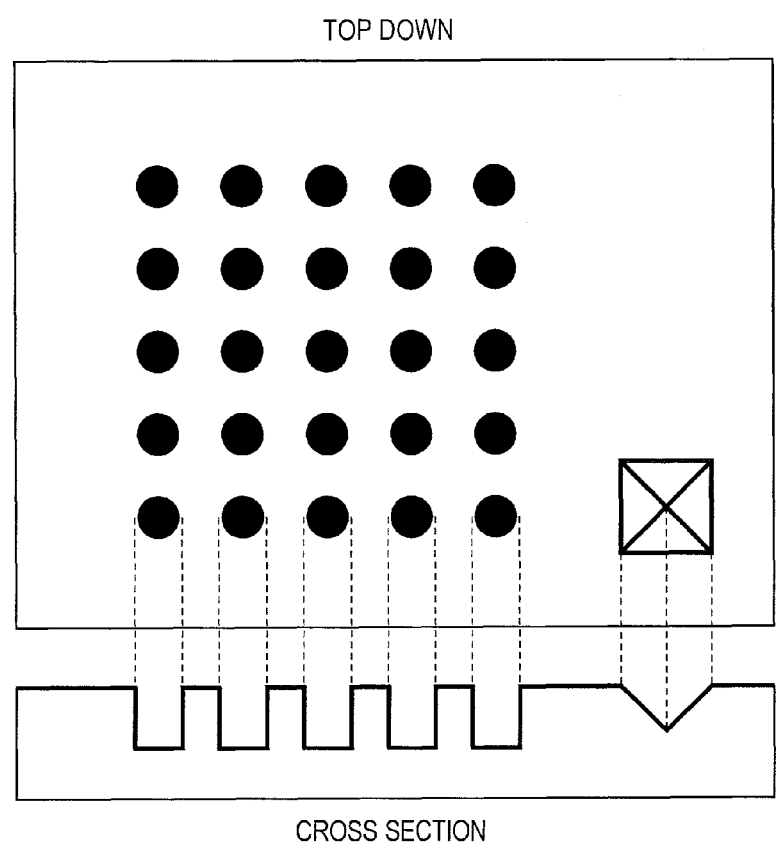
FIG. 23 is a schematic view showing other example of a measurement mark used in the charged particle instrument according to the ninth embodiment.

Further, when there is used a sample in which the micro hole-array mark and the pyramid mark are present in the same sample as shown in FIG. 23, calibration of the correction coefficient according to the present embodiment and measurement and correction of the landing angle according to the first through the eighth embodiments can be carried out continuously using the same sample. Time and labor of interchanging the sample are saved, the operation becomes simple and convenient. The micro hole-array can be formed by subjecting a silicon substrate to dry etching. On the other hand, the pyramid mark can be formed using anisotropic etching for the silicon substrate. Therefore, the combination of the two marks becomes a combination which is effective in being formed on the same substrate.

When CD of lines on a semiconductor substrate is measured by shifting an image using SEM (charged particle instrument) according to the present embodiment, an excellent result is achieved.

As described above, according to the present embodiment, there can be provided the charged particle instrument which can make the wide deflection region and the high CD reproducibility compatible with each other in shifting an image. In addition, measurement with higher accuracy can be calculated by calibrating the correction coefficients A, B, C, and D (FIG. 5). Furthermore, measurement and correction of the landing angle and the various kinds of aberrations and calibration of the correction coefficients can be performed simply and conveniently by providing the mark for the landing angle and various kinds of aberrations and the mark for calibrating the correction coefficients in the same sample.

Incidentally, the present invention is not limited to the embodiments described above but includes various modified examples. For example, the embodiments described above are explained in details in order to explain the present invention for easy understanding, and are not necessarily limited to provide all of configurations explained. In addition, a portion of a configuration of a certain embodiment can be replaced by a configuration of other embodiment and a configuration of other embodiment can be added to a configuration of a certain embodiment. Also, with regard to a portion of a configuration of each embodiment, addition or deletion or substitution of other configuration can be carried out.

What is claimed is:

1. A charged particle instrument comprising:
    a charged-particle source, configured to emit a charged particle beam;
    a deflector, configured to deflect the charged particle beam;
    a focus changing unit, configured to change a focus of the charged particle beam;
    a detector, configured to detect an electric signal from a sample irradiated with the charged particle beam;
    a recording unit, configured to preserve a correction coefficient registered for each image-acquisition condition; and
    a controlling and operating unit, including a processor, configured to:
        control the charged-particle source, the deflector, and the focus changing unit, generate data for an image, from the electric signal detected by the detector,
        acquire a plurality of images of a mark on the sample, by, for each of the plurality of images, controlling the focus changing unit to change the focus, and by controlling the deflector to deflect the charged particle beam by a prescribed amount, and
        control an optical condition such that a landing angle of the charged particle beam becomes a pre-determined value, when an image for measurement is acquired, by controlling the deflector to deflect the charged particle beam by an arbitrary amount, on the basis of:
            a position shift amount of the mark between at least a first of the plurality of images of the mark acquired at a first focus and at least a second of the plurality of images acquired at a second focus,
            and the correction coefficient registered to the recording unit.

2. The charged particle instrument according to claim 1, wherein the controlling and operating unit is further configured to:
    deflect the charged particle beam by a plurality of different amounts, by control of the deflector, acquire the plurality of the images of the mark on the sample for respective deflection amounts, by controlling the focus changing unit to change the focus.

3. The charged particle instrument according to claim 2, wherein the controlling and operating unit is further configured to:
when the image for measurement is acquired, calculate a distortion aberration from a plurality of the acquired images of the mark, and further control the optical condition on the basis of the calculated distortion aberration by controlling the deflector to deflect the charged particle beam by the arbitrary amount.

4. The charged particle instrument according to claim 2, wherein the controlling and operating unit is further configured to:
calculate a beam diameter of the charged particle beam, from a plurality of the acquired images of the mark.

5. The charged particle instrument according to claim 1, further comprising:
an astigmatism corrector, configured to correct an astigmatism aberration of the charged particle beam,
wherein the controlling and operating unit is configured to control the astigmatism corrector, and wherein the controlling and operating unit is configured to further control the optical condition, on the basis of:
a position shift amount of the mark in the acquired image of the mark,
a correction coefficient registered to the recording unit, and
at least one of a field curvature aberration and an astigmatism aberration calculated from the plurality of the acquired images of the mark.

6. The charged particle instrument according to claim 5, wherein the controlling and operating unit is further configured to:
deflect the charged particle beam by a plurality of different amounts,
by control of the deflector, acquiring the plurality of images of the mark on the sample,
by changing the focus for respective deflection amounts, and
when the image for measurement is acquired, control the optical condition by controlling the deflector to deflect the charged particle beam by an arbitrary amount on the basis of: the position shift amount of the mark in the acquired image of the mark, the correction coefficient registered to the recording unit, and at least one of the field curvature aberration and the astigmatism aberration calculated from the plurality of acquired images of the mark.

7. The charged particle beam instrument according to claim 6, wherein the controlling and operating unit is further configured to:
calculate a distortion aberration from the plurality of acquired images of the mark, and
when the image for measurement is acquired, further control the optical condition on the basis of the calculated distortion aberration, by controlling the deflector to deflect the charged particle beam by an arbitrary amount.

8. The charged particle instrument according to claim 1, wherein the controlling and operating unit is further configured to:
control the optical condition on the basis of: the position shift amount of the mark in the acquired image, and the correction coefficient registered to the recording unit, and
calculate a correction value, by correcting a coefficient calculated from: a relationship between the position shift amount of the mark in the acquired image of the mark, and the focus, by using the correction coefficient registered to the recording unit, and
control the optical condition, on the basis of the correction value.

9. The charged particle instrument according to claim 8, wherein the correction value corresponds to the landing angle of the charged particle beam.

10. The charged particle instrument according to claim 1, wherein the focus changing unit is configured to apply a voltage to a stage used for mounting the sample.

11. The charged particle instrument according to claim 1, wherein the mark on the sample includes a plurality of hole patterns.

12. A charged particle instrument comprising:
a charged-particle source, configured to emit a charged particle beam;
a deflector, configured to deflect the charged particle beam;
a focus changing unit, configured to change a focus of the charged particle beam;
a detector, configured to detect an electric signal from a sample irradiated with the charged particle beam;
a recording unit, configured to preserve a correction coefficient registered for each image-acquisition condition; and
a controlling and operating unit, including a processor, configured to:
control the charged-particle source, the deflector, and the focus changing unit,
generate data for an image, from the electric signal detected by the detector,
acquire a plurality of images of a mark on the sample, by, for each of the plurality of images, controlling the focus changing unit to change the focus, and by controlling the deflector to deflect the charged particle beam by a prescribed amount,
acquire an image of a small pattern made on the sample, by controlling the deflector to deflect the charged particle beam by the prescribed amount,
measure a dimension of the small pattern, on the basis of the image of the small pattern, and
correct a measured value of the small pattern on the basis of: a position shift amount of the mark between at least a first of the plurality of images of the mark acquired at a first focus and at least a second of the plurality of images acquired at a second focus, and the correction coefficient registered to the recording unit,
wherein the focus changing unit is configured to apply a voltage to a stage used for mounting the sample.

13. The charged particle instrument according to claim 12, wherein correcting the measured value of the small pattern includes:
calculating a correction value, by correcting a coefficient calculated from a relationship between the positional shift amount of the mark in the acquired image of the mark and the focus using the correction coefficient registered to the recording unit, and
correcting the measured value of the small pattern on the basis of the correction value.

14. A charged particle instrument comprising:
a charged-particle source, configured to emit a charged particle beam;
a deflector, configured to deflect the primary charged particle beam;

a focus changing unit, configured to change a focus of the primary charged particle beam emitted from the charged particle source;

a detector, configured to detect an electric signal from a sample irradiated with the primary charged particle beam;

a recording unit, configured to preserve a correction coefficient registered for each image-acquisition condition; and a controlling and operating unit, including a processor, configured to:

control the charged-particle source, the deflector, and the focus changing unit, generate data for an image, from the electric signal detected by the detector, deflect the primary charged beam, by a plurality of different amounts, by control of the deflector, acquire an image of a mark whose three-dimensional shape on the sample is already known, wherein the sample further includes a mark including a plurality of hole patterns, calculate a landing angle of the primary charged particle beam from a shape pattern of the acquired image of the mark, and register a coefficient calculated from a relationship between a deflection amount of the primary charged beam and the calculated landing angle to the recording unit.

* * * * *